(12) United States Patent
Ahirrao (10) Patent No.: US 11,354,274 B1
(45) Date of Patent: Jun. 7, 2022

(54) SYSTEM AND METHOD FOR PERFORMING DATA MINIMIZATION WITHOUT READING DATA CONTENT

(71) Applicant: Sameer Chandrakant Ahirrao, Ellicott City, MD (US)

(72) Inventor: Sameer Chandrakant Ahirrao, Ellicott City, MD (US)

(73) Assignee: Sameer Chandrakant Ahirrao

( * ) Notice: Subject to any disclaimer, the term of this patent is extended or adjusted under 35 U.S.C. 154(b) by 0 days.

(21) Appl. No.: 17/531,822

(22) Filed: Nov. 22, 2021

Related U.S. Application Data (60) Provisional application No. 63/166,279, filed on Mar. 26, 2021.

(51) Int. Cl.
*G06F 7/00* (2006.01)
*G06F 16/174* (2019.01)
*G06N 20/00* (2019.01)

(52) U.S. Cl.
CPC ........... *G06F 16/174* (2019.01); *G06N 20/00* (2019.01)

(58) Field of Classification Search
CPC .............................. G06F 16/174; G06N 20/00
USPC .................................................. 707/600–899
See application file for complete search history.

(56) References Cited

U.S. PATENT DOCUMENTS

| | | | |
|---|---|---|---|
| 9,691,027 B1 | 6/2017 | Sawant et al. | |
| 10,043,035 B2 | 8/2018 | LaFever et al. | |
| 10,685,138 B2 | 6/2020 | Scaiano et al. | |
| 2016/0078367 A1 | 3/2016 | Adjaoute | |
| 2020/0111100 A1 | 4/2020 | Adjaoute | |
| 2021/0109945 A1* | 4/2021 | Sastry | G06F 40/205 |

OTHER PUBLICATIONS

Binod Adnikan, Wan Li Zuo, Ramesn Maharjan, Lin Guo; Sensitive Data Detection using NN and KNN from Big Data: 18th International Conference, ICA3PP 2018, Guangzhou, China, Nov. 15-17, 2018, Proceedings, Part IV; Nov. 2018; https://www.researchgate.net/publication/329477524_Sensitive_Data_Detection_Using_NN_and_KNN_from_Big_Data_18th_International_Conference_ICA3PP_2018_Guangzhou_China_November_15-17_2018_Proceedings_Part_IV.

* cited by examiner

*Primary Examiner* — Isaac M Woo
(74) *Attorney, Agent, or Firm* — Jason C. Cameron (57) ABSTRACT

A system and method for performing data minimization without reading data content is disclosed. The method includes receiving a request from a user to perform data minimization and retrieving metadata associated with plurality of datasets based on the request. The method further includes determining one or more characteristics of the retrieved metadata based on one or more data parameters and one or more derived data parameters and generating one or more minimization parameters and one or more data sensitivity parameters for each of the plurality of datasets by using a trained data minimization based ML and NLP model. The method includes determining portions of the plurality of datasets based on the one or more minimization parameters, the one or more data sensitivity parameters, privacy regulations and business requirements and performing one or more minimizing operations on the determined portions of the plurality of datasets based on prestored rules.

14 Claims, 4 Drawing Sheets

SYSTEM AND METHOD FOR PERFORMING DATA MINIMIZATION WITHOUT READING DATA CONTENT

EARLIEST PRIORITY DATE

This application claims priority from a Provisional patent application filed in the United States of America having Patent Application No. 63/166,279, filed on Mar. 26, 2021, and titled "SYSTEM AND METHOD FOR PERFORMING DATA MINIFICATION INDEPENDENT OF ACTUAL CONTENT OF DATA".

FIELD OF INVENTION

Embodiments of the present disclosure relate to a data minimization system and more particularly relates to a system and a method for performing data minimization without reading data content.

BACKGROUND

Generally, most key businesses in an enterprise are data driven. For such enterprises, the amount of data available is huge and grows every day. Further, more and more such data including business data, personal data, security data, consumer data, and the like are added to an already existing large pool of data of the enterprise. Thus, it is very difficult to track and govern all such data generated every day. Furthermore, ever-expanding unstructured data in a database hampers efficiency of computing assets and makes it difficult to retrieve data having useful information. Also, huge amount of data elevates challenges to security of the data. Privacy regulations such as 'The General Data Protection Regulation 2016/679, EU (GDPR) and California Consumer Privacy Act (CCPA) mandates that enterprises should not keep personal data of citizens without purpose. Accordingly, it is very difficult for the organization to manage the data by considering the privacy regulations.

Conventionally, the data available with the computing assets is optimized and reduced by reading actual content of the data and then selectively deleting useless redundant data based on reading of the actual content of the data in a process known as "selective cleaning". The process of selective cleaning ensures privacy as well as protection of sensitive data. However, reading content of a large data pool is a hectic and expensive task. Also, it consumes a significant amount of time to read content of the large data pool.

Hence, there is a need for a system and method for performing data minimization without reading data content in order to address the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

In accordance with an embodiment of the present disclosure, a computing system for performing data minimization without reading data content is disclosed. The computing system includes one or more software, learning module, hardware processors and a memory coupled to the one or more hardware processors. The memory includes a plurality of modules in the form of programmable instructions executable by the one or more hardware processors. The plurality of modules include a data receiver module configured to receive a request from a user to perform data minimization on a plurality of datasets associated with an organization of the user. The data receiver module is also configured to retrieve metadata associated with the plurality of datasets of the organization from one or more storage servers of the organization based on the received request. The plurality of modules also include a characteristics determination module configured to determine one or more characteristics of the retrieved metadata based on one or more data parameters and one or more derived data parameters corresponding to the plurality of datasets. The plurality of modules further include a data generation module configured to generate one or more minimization parameters and one or more data sensitivity parameters for each of the plurality of datasets by applying the determined one or more characteristics onto a trained data minimization based Machine Learning (ML) and Natural Language Processing (NLP) model. Furthermore, the plurality of modules include a data determination module configured to determine portions of the plurality of datasets based on the one or more minimization parameters, the one or more data sensitivity parameters, privacy regulations and business requirements by using the trained data minimization based ML and NLP model. Also, the plurality of modules include an operation performance module configured to perform one or more minimizing operations on the determined portions of the plurality of datasets based on prestored rules to minimize the plurality of datasets.

In accordance with another embodiment of the present disclosure, a method for performing data minimization without reading data content is disclosed. The method includes receiving a request from a user to perform data minimization on a plurality of datasets associated with an organization of the user. The method also includes retrieving metadata associated with the plurality of datasets of the organization from one or more storage servers of the organization based on the retrieved request. The method further includes determining one or more characteristics of the retrieved metadata based on one or more data parameters and one or more derived data parameters corresponding to the plurality of datasets. Further, the method includes generating to one or more minimization parameters and one or more data sensitivity parameters for each of the plurality of datasets by applying the determined one or more characteristics onto a trained data minimization based Machine Learning (ML) and Natural Language Processing (NLP) model. The method also includes determining portions of the plurality of datasets based on the one or more minimization parameters, the one or more data sensitivity parameters, privacy regulations and business requirements by using the trained data minimization based ML and NLP model. Furthermore, the method includes performing one or more minimizing operations on the determined portions of the plurality of datasets based on prestored rules to minimize the plurality of datasets.

To further clarify the advantages and features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF DRAWINGS

The disclosure will be described and explained with additional specificity and detail with the accompanying figures in which.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the embodiments of the present disclosure so as not to obscure the figures with details that will be readily apparent to those skilled in the art having the benefit of the description herein.

DETAILED DESCRIPTION OF THE DISCLOSURE

For the purpose of promoting an understanding of the principles of the disclosure, reference will now be made to the embodiment illustrated in the figures and specific language will be used to describe them. It will nevertheless be understood that no limitation of the scope of the disclosure is thereby intended. Such alterations and further modifications in the illustrated system, and such further applications of the principles of the disclosure as would normally occur to those skilled in the art are to be construed as being within the scope of the present disclosure. It will be understood by those skilled in the art that the foregoing general description and the following detailed description are exemplary and explanatory of the disclosure and are not intended to be restrictive thereof.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules. Appearances of the phrase "in an embodiment", "in another embodiment" and similar language throughout this specification may, but not necessarily do, all refer to the same embodiment.

Unless otherwise defined, all technical and scientific terms used herein have the same meaning as commonly understood by those skilled in the art to which this disclosure belongs. The system, methods, and examples provided herein are only illustrative and not intended to be limiting.

A computer system (standalone, client or server computer system) configured by an application may constitute a "module" (or "subsystem") that is configured and operated to perform certain operations. In one embodiment, the "module" or "subsystem" may be implemented mechanically or electronically, so a module include dedicated circuitry or logic that is permanently configured (within a special-purpose processor) to perform certain operations. In another embodiment, a "module" or "subsystem" may also comprise programmable logic or circuitry (as encompassed within a general-purpose processor or other programmable processor) that is temporarily configured by software to perform certain operations. In another embodiment, a "module" or "subsystem" may also comprise programmable logic or circuitry (as encompassed within a general-purpose processor or other programmable processor) that is temporarily configured by software to perform certain operations.

Accordingly, the term "module" or "subsystem" should be understood to encompass a tangible entity, be that an entity that is physically constructed permanently configured (hardwired) or temporarily configured (programmed) to operate in a certain manner and/or to perform certain operations described herein.

Referring now to the drawings, and more particularly to FIG. 1 through FIG. 4, where similar reference characters denote corresponding features consistently throughout the figures, there are shown preferred embodiments and these embodiments are described in the context of the following exemplary system and/or method.

Figure 1:
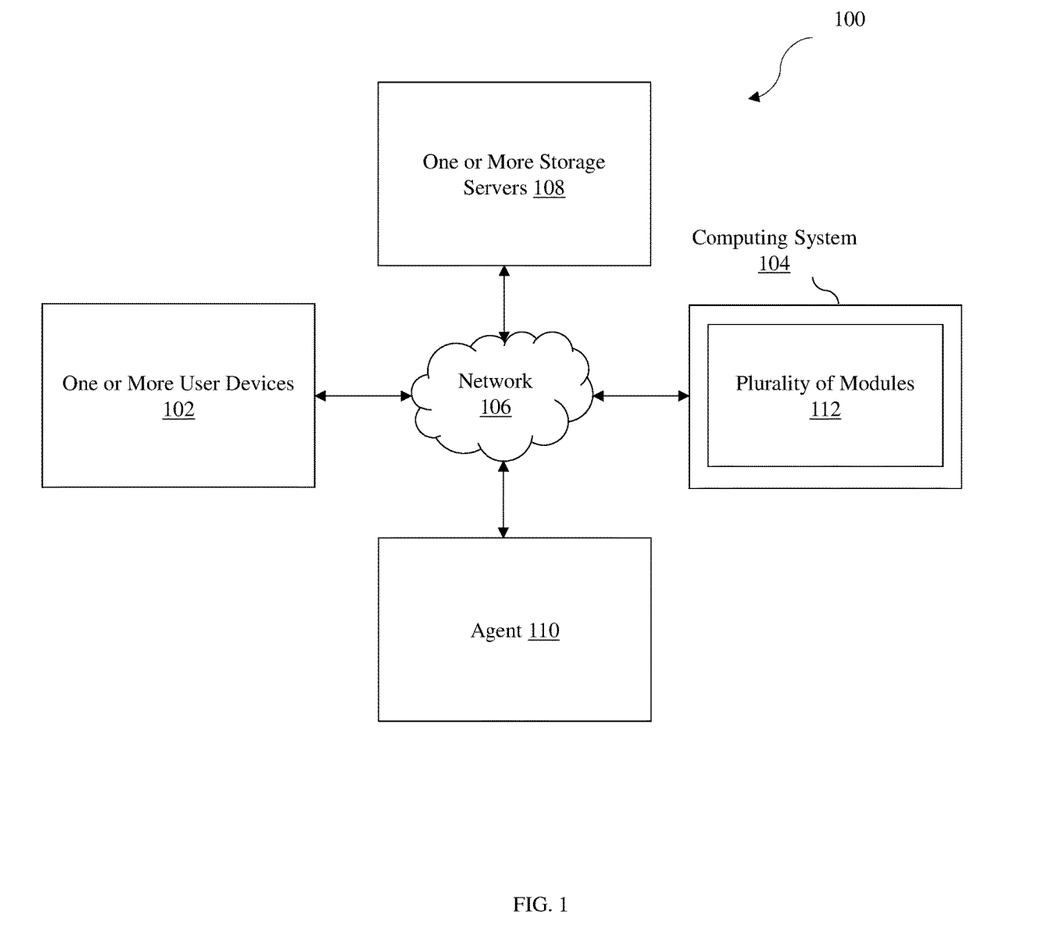
FIG. 1 is a block diagram illustrating an exemplary computing environment for performing data minimization without reading data content, in accordance with an embodiment of the present disclosure.

FIG. 1 is a block diagram illustrating an exemplary computing environment 100 for performing data minimization without reading data content, in accordance with an embodiment of the present disclosure. According to FIG. 1, the computing environment 100 includes one or more user devices 102 associated with a user communicatively coupled to a computing system 104 via a network 106. The one or more user devices 102 may be used by the user to generate a request for performing data minimization on a plurality of datasets associated with an organization of the user. The user may also use the one or more user devices 102 for providing one or more recommendations to prioritize one or more features. Details on the one or more features have been elaborated in subsequent paragraphs of the present description with reference to FIG. 2. Further, the one or more user devices 102 are used by the user to receive one or more recommendations to delete or redact portions of the plurality datasets. In an exemplary embodiment of the present disclosure, the one or more user devices 102 may include a laptop computer, desktop computer, tablet computer, smartphone, wearable device, smart watch and the like. In an exemplary embodiment of the present disclosure, the network 106 may be internet or any other wireless network. Furthermore, the computing system 104 may be hosted on a central server, such as cloud server or a remote server.

Further, the computing environment 100 includes one or more storage servers 108 of the organization configured to store the plurality of datasets. In an exemplary embodiment of the present disclosure, the one or more storage servers 108 is a local server or a cloud storage. The computing environment 100 also includes an agent 110 deployed at the one or more storage servers 108. The agent 110 is configured to collect metadata associated with the plurality of datasets and transmit the collected metadata to the computing system 104. Furthermore, the agent 110 is also configured to securely delete or securely redact the portions of the plurality datasets remotely for minimizing the plurality of datasets.

Furthermore, the one or more user devices 102 include a local browser, a mobile application or a combination thereof. Furthermore, the user may use a web application via the local browser, the mobile application or a combination thereof to communicate with the computing system 104. The user may use the computing system 104 to perform one or more minimizing operations on portions of the plurality of datasets to minimize the plurality of datasets. The computing system 104 includes a plurality of modules 112. Details on the plurality of modules 112 have been elaborated in subsequent paragraphs of the present description with reference to FIG. 2.

In an embodiment of the present disclosure, the computing system 104 is configured to receive the request from the user to perform data minimization on the plurality of datasets associated with the organization of the user. The computing system 104 retrieves metadata associated with the plurality of datasets of the organization from the one or more storage servers 108 of the organization based on the received request. Further, the computing system 104 also determines one or more characteristics of the retrieved metadata based on one or more data parameters and one or more derived data parameters corresponding to the plurality of datasets. The computing system 104 generates one or more minimization parameters and one or more data sensitivity parameters for each of the plurality of datasets by applying the determined one or more characteristics onto a trained data minimization based Machine Learning (ML) and Natural Language Processing (NLP) model. Further, the computing system 104 determine the portions of the plurality of datasets based on the one or more minimization parameters, the one or more data sensitivity parameters, privacy regulations and business requirements by using the trained data minimization based ML and NLP model. Furthermore, the computing system 104 performs the one or more minimizing operations on the determined portions of the plurality of datasets based on prestored rules to minimize the plurality of datasets.

Figure 2:
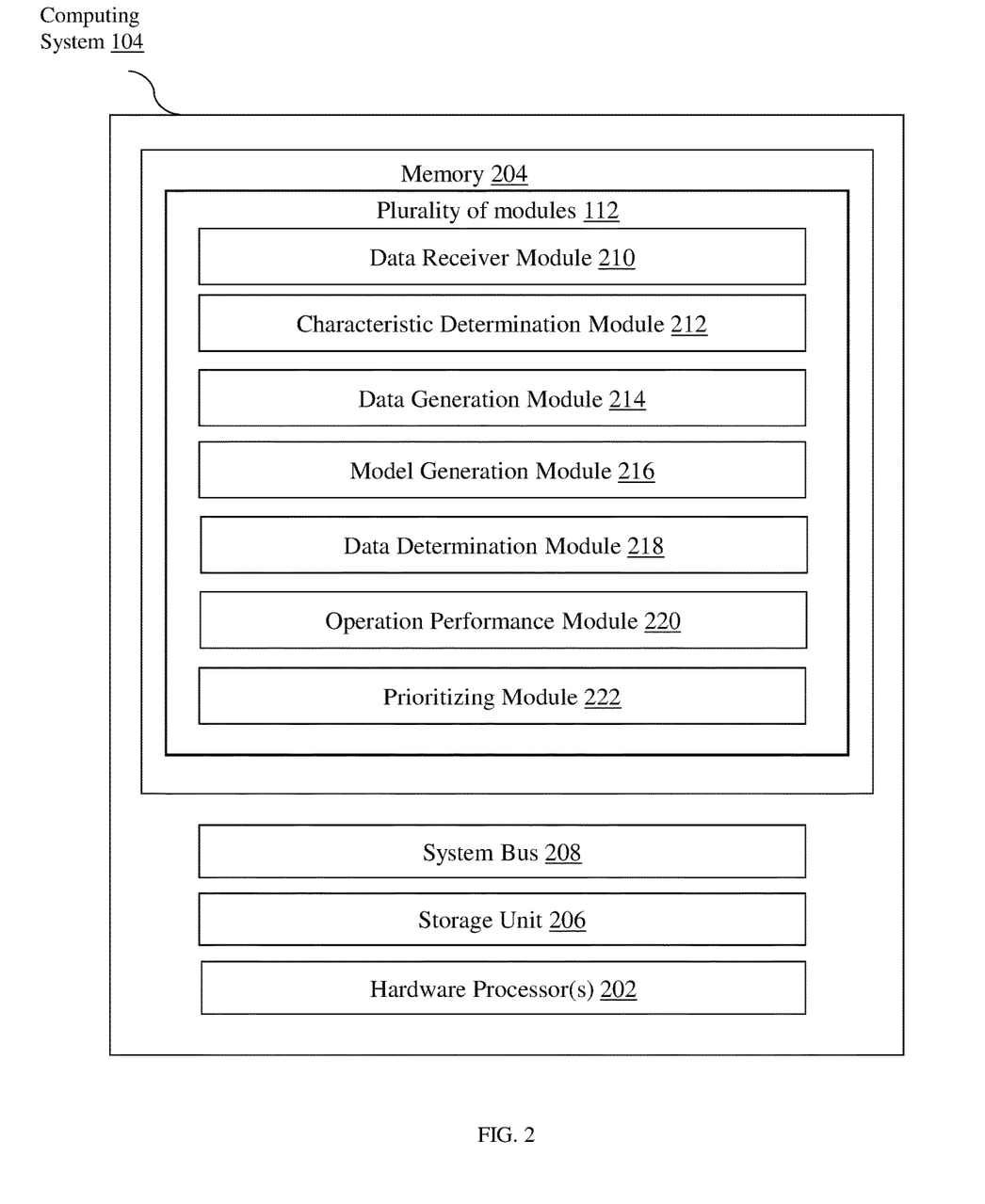
FIG. 2 is a block diagram illustrating an exemplary computing system, such as those shown in FIG. 1, for performing data minimization without reading the data content, in accordance with an embodiment of the present disclosure.

FIG. 2 is a block diagram illustrating an exemplary computing system 104, such as those shown in FIG. 1, for performing data minimization without reading the data content, in accordance with an embodiment of the present disclosure. The computing system 104 comprises one or more hardware processors 202, a memory 204 and a storage unit 206. The one or more hardware processors 202, the memory 204 and the storage unit 206 are communicatively coupled through a system bus 208 or any similar mechanism. The memory 204 comprises the plurality of modules 112 in the form of programmable instructions executable by the one or more hardware processors 202. Further, the plurality of modules 112 includes a data receiver module 210, a characteristics determination module 212, a data generation module 214, a model generation module 216, a data determination module 218, an operation performance module 220 and a prioritizing module 222.

The one or more hardware processors 202, as used herein, means any type of computational circuit, such as, but not limited to, a microprocessor unit, microcontroller, complex instruction set computing microprocessor unit, reduced instruction set computing microprocessor unit, very long instruction word microprocessor unit, explicitly parallel instruction computing microprocessor unit, graphics processing unit, digital signal processing unit, or any other type of processing circuit. The one or more hardware processors 202 may also include embedded controllers, such as generic or programmable logic devices or arrays, application specific integrated circuits, single-chip computers, and the like.

The memory 204 may be non-transitory volatile memory and non-volatile memory. The memory 204 may be coupled for communication with the one or more hardware processors 202, such as being a computer-readable storage medium. The one or more hardware processors 202 may execute machine-readable instructions and/or source code stored in the memory 204. A variety of machine-readable instructions may be stored in and accessed from the memory 204. The memory 204 may include any suitable elements for storing data and machine-readable instructions, such as read only memory, random access memory, erasable programmable read only memory, electrically erasable programmable read only memory, a hard drive, a removable media drive for handling compact disks, digital video disks, diskettes, magnetic tape cartridges, memory cards, and the like. In the present embodiment, the memory 204 includes the plurality of modules 112 stored in the form of machine-readable instructions on any of the above-mentioned storage media and may be in communication with and executed by the one or more hardware processors 202.

The storage unit 206 may be a cloud storage. The storage unit 206 may store metadata associated with the plurality of datasets, one or more minimization parameters, one or more data sensitivity parameters, the privacy regulations, the business requirements, one or more data attributes and one or more features. The storage unit 206 may also store one or more recommendations, one or more deletion parameters, the one or more data parameters and the one or more derived data parameters.

The data receiver module 210 is configured to receive the request from the user to perform data minimization on the plurality of datasets associated with the organization of the user. In an exemplary embodiment of the present disclosure, the plurality of datasets include business data, personal data, security data, consumer data and the like. In an embodiment of the present disclosure, the plurality of datasets are stored in the one or more storage servers 108 of the organization. In an exemplary embodiment of the present disclosure, the one or more storage servers 108 is the local server or the cloud storage. Further, the data receiver module 210 retrieves the metadata associated with the plurality of datasets of the organization from the one or more storage servers 108 of the organization based on the received request. In an embodiment of the present disclosure, the agent 110 is deployed at the one or more storage servers 108 to collect the metadata associated with the plurality of datasets based on the received request and store the collected metadata in the storage unit 206. In collecting the metadata, the agent 110 discovers and scans the metadata associated with the plurality of data sets, such that the metadata may be collected. The agent 110 may be a script. In another embodiment of the present disclosure, the agent 110 may collect the metadata associated with the plurality of datasets after a predefined interval of time and store the collected metadata in the storage unit 206.

The characteristics determination module 212 is configured to determine one or more characteristics of the retrieved metadata based on the one or more data parameters and the one or more derived data parameters corresponding to the plurality of datasets. In an embodiment of the present disclosure, the one or more characteristics are determined by performing data characterization on the retrieved metadata.

In an exemplary embodiment of the present disclosure, the one or more data parameters and the one or more derived data parameters include data age, access recency, modified recency, depth, size, written, extension, date created, date modified, data accessed, path, auto tags, unwritten, unaccessed, extensions and owner. In an embodiment of the present disclosure, the one or more derived parameters are derived from the one or more data parameters.

The data generation module 214 is configured to generate the one or more minimization parameters and the one or more data sensitivity parameters for each of the plurality of datasets by applying the determined one or more characteristics onto the trained data minimization based Machine Learning (ML) and Natural Language Processing (NLP) model. In an exemplary embodiment of the present disclosure, the trained data minimization based ML and NLP model may be decision tree, random forest and the like. In an exemplary embodiment of the present disclosure, the one or more minimization parameters and the one or more data sensitivity parameters include Indicator of Minimization (IoM), Indicators of Privacy Use (IoPU), Indicators of Confidentiality (IoC), data stratification and risk score. The IoM is used to determine if the plurality of datasets are required to be minimized. The IoPU is used to determine if the plurality of datasets include private information. Furthermore, the IoC is used to determine if the plurality of datasets include confidential information. The data stratification is used to determine if the plurality of datasets are required to be stratified. The risk score is used to determine of the plurality of datasets are required to be deleted or retained. For example, when the risk score associated with a dataset is above 90, the dataset should be deleted. Further, when the risk score associated with a dataset is below 60, the dataset should be retained. In an embodiment of the present disclosure, the user may provide a set of inputs to define data assets and accuracy of results. The user may provide an input corresponding to risk scores and tagging of assets based on specific requirements which may be further used to improve accuracy of large dataset.

In an embodiment of the present disclosure, before using the trained data minimization based ML and NLP model, the trained data minimization based ML and NLP model is required to be generated. The model generation module 216 is configured to generate the trained data minimization based ML and NLP model. In generating the trained data minimization based ML and NLP model, the model generation module 216 performs one or more operations on the retrieved metadata to handle missing data, noisy data or a combination thereof. In an embodiment of the present disclosure, the one or more operations are performed to avoid uncertainties while generating the trained data minimization based ML and NLP model. The model generation module 216 performs the one or more operations on the retrieved metadata to transform the metadata into a usable form, such that the trained data minimization based ML and NLP model may be generated. In an exemplary embodiment of the present disclosure, the one or more operations include missing data imputation, typecasting, handling duplicates, outliers and the like. Further, the model generation module 216 extracts one or more features from the retrieved metadata based on one or more data attributes upon performing the one or more operations. In an embodiment of the present disclosure, the one or more features are extracted by performing feature engineering on the retrieved metadata. In an exemplary embodiment of the present disclosure, the one or more data attributes include path, date of creation, date of modification, access date, extension of each of the plurality of datasets and the like. In an exemplary embodiment of the present disclosure, the one or more features include access recency, modification recency, data age, department and the like. Furthermore, the model generation module 216 scales the extracted one or more features of the plurality of datasets by using one or more scaling techniques. In an embodiment of the present disclosure, the extracted one or more features are scaled to prevent the trained data minimization based ML and NLP model from being biased towards the one or more features. In an exemplary embodiment of the present disclosure, the one or more scaling techniques include standardization technique and normalization technique. The model generation module 216 generates the trained data minimization based ML and NLP model based on the retrieved metadata, the one or more data attributes and the scaled one or more features. In an embodiment of the present disclosure, one or more inputs may be received from the user corresponding to the one or more features, such that the one or more inputs along with the one or more features are used as an input to generate the trained data minimization based ML and NLP model. In an embodiment of the present disclosure, the trained data minimization based ML and NLP model converts one or more file paths into the one or more features, such that the one or more features associated with the one or more file paths may be converted into a machine-readable format.

In an embodiment of the present disclosure, after generating the trained data minimization based ML and NLP model, the trained data minimization based ML and NLP model is evaluated to determine if the trained data minimization based ML and NLP model meets a predetermined accuracy level. Further, based on resultant accuracy of the trained data minimization based ML and NLP model, hyperparameter tuning for the trained data minimization based ML and NLP model is performed for generating a generalized model to adapt to new information and provide accurate output to new data.

The data determination module 218 is configured to determine the portions of the plurality of datasets based on the one or more minimization parameters, the one or more data sensitivity parameters, the privacy regulations and the business requirements by using the trained data minimization based ML and NLP model. For example, a company faces a legal action by regulators to search and delete data of citizens or data subjects has requested deletion of data associated with them by claiming their legal rights. In the current example, the legal action by the regulator and request of the data subjects to delete the data associated with them are business requirements. In an exemplary embodiment of the present disclosure, the privacy regulations may be The General Data Protection Regulation 2016/679, EU (GDPR), California Consumer Privacy Act (CCPA) and the like. In an embodiment of the present disclosure, geolocation of the plurality of datasets is recorded and tagged based on initial and repetitive scan of the plurality of datasets, user input or a combination thereof. In an embodiment of the present disclosure, the geolocation of the plurality of datasets is tracked throughout the lifecycle. Further, geolocation of data subject is recorded by one or more personal data fields, such as address, phone number and the like and maintained throughput lifecycle. In the current scenario, the data subject is the user. In an embodiment of the present disclosure, the privacy regulations used for determining the portions of the plurality of datasets is determined based on the geolocation of the plurality of datasets and the geolocation of the data subjects. In determining the portions of the plurality of datasets based on the one or more minimization parameters, the one or more data sensitivity parameters, the privacy regulations and the business requirements by using the trained data minimization based ML and NLP model to achieve the data minimization, the data determination module 218 classifies one or more portions of the plurality of datasets into sensitive data, Personally Identifiable Information (PII), non-sensitive data, sensitive data, private data, confidential data or any combination thereof based on the one or more minimization parameters, the one or more data sensitivity parameters, the privacy regulations and the business requirements by using the trained data minimization based ML and NLP model. Further, the data determination module 218 classifies one or more portions of the plurality of datasets into relevant data, irrelevant data or a combination thereof based on the one or more minimization parameters, the one or more data sensitivity parameters, the privacy regulations and the business requirements by using the trained data minimization based ML and NLP model. In an embodiment of the present disclosure, the relevant data is data associated with the plurality of datasets which is not redundant and required for long term storage. The data determination module 218 determines the portions of the plurality of datasets based on the classified one or more portions by using the trained data minimization based ML and NLP model.

The operation performance module 220 is configured to perform the one or more minimizing operations on the determined portions of the plurality of datasets based on prestored rules to minimize the plurality of datasets. In an embodiment of the present disclosure, the prestored rules are used to determine which operation needs to be performed on the portions of the plurality of datasets. In an exemplary embodiment of the present disclosure, the one or more minimizing operations include securely deleting the portions of the plurality datasets remotely by using the agent 110, securely redacting the portions of the plurality datasets remotely by using the agent 110, outputting one or more recommendations on the one or more user devices 102 associated with the user to delete or redact the portions of the plurality datasets and the like. In an exemplary embodiment of the present disclosure, the one or more user devices 102 may include a laptop computer, desktop computer, tablet computer, smartphone, wearable device, smart watch and the like.

In an embodiment of the present disclosure, the prioritizing module 222 is configured to prioritize the one or more features based on one or more user recommendations. In an embodiment of the present disclosure, the one or more recommendations improve accuracy of the trained data minimization based ML and NLP model. For example, when the user recommends that a file or a folder is a data asset or not, the user recommendation is provided as an input to the trained data minimization based ML and NLP model for achieving better decision-making capabilities for analyzing the data.

Further, the data generation module 214 is configured to generate a compliance certificate based on one or more deletion parameters upon deleting the portions of the plurality datasets. In an exemplary embodiment of the present disclosure, the one or more deletion parameters include size of datasets deleted, number of the datasets deleted, type of the datasets deleted and the like. In an embodiment of the present disclosure, lifecycle corresponding to deletion of the portions of the plurality of datasets is tracked to enforce and keep proof of Right To Be Forgotten (RTBF) for regulatory or recording purposes.

In an embodiment of the present disclosure, the trained data minimization based ML and NLP model performs reinforcement learning based on the extracted one or more features, the one or more characteristics, the generated one or more minimization parameters, the generated one or more data sensitivity parameters and the one or more minimizing operations. In an embodiment of the present disclosure, the reinforcement learning improves accuracy of the trained data minimization based ML and NLP model.

Figure 3:
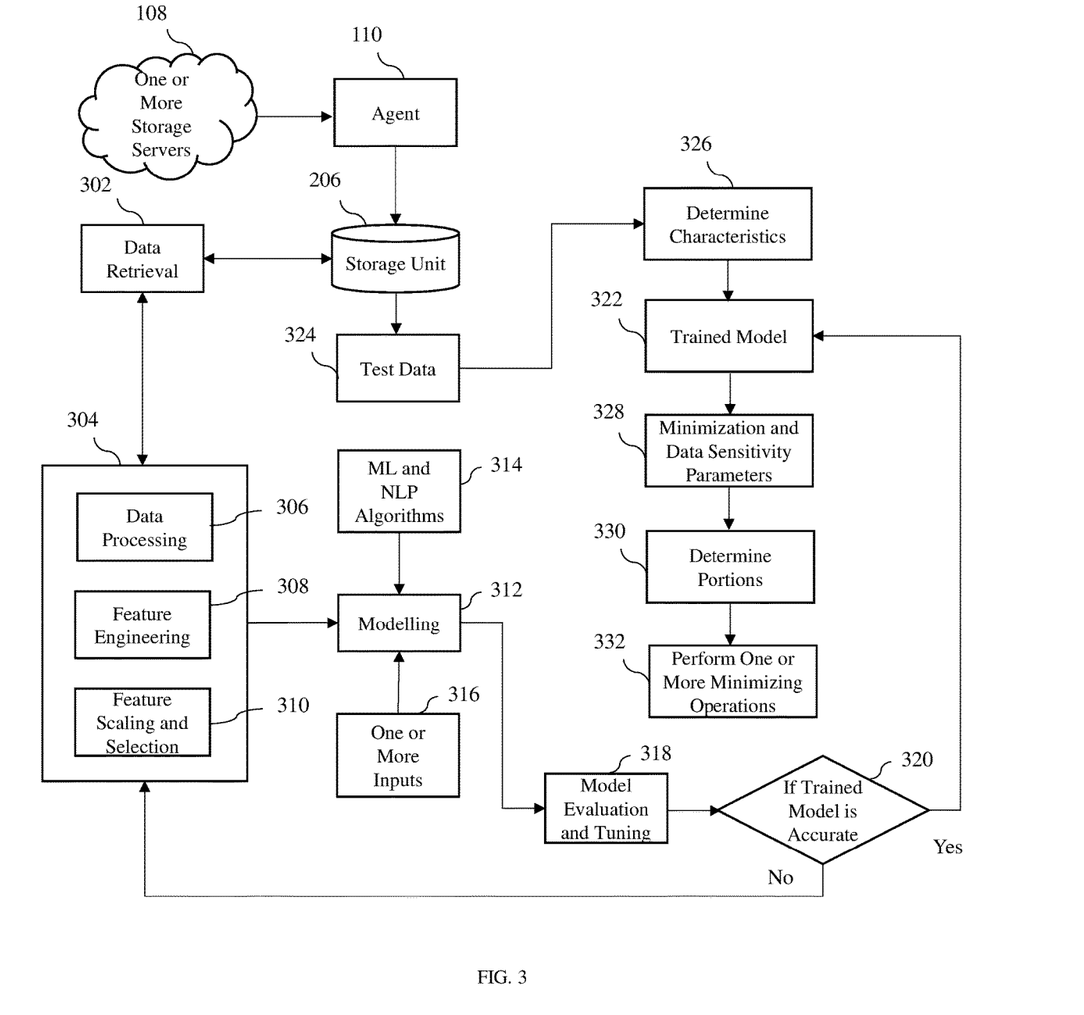
FIG. 3 is a process flow diagram illustrating exemplary operation of the computing system for performing data minimization without reading the data content, in accordance with an embodiment of the present disclosure.

FIG. 3 is a process flow diagram illustrating exemplary operation of the computing system 104 for performing data minimization without reading the data content, in accordance with an embodiment of the present disclosure. The computing system 104 receives the request from the user to perform data minimization on the plurality of datasets associated with the organization of the user. The plurality of datasets are stored in the one or more storage servers 108. Further, the agent 110 collects the metadata associated with the plurality of datasets and stores the collected metadata in the storage unit 206. At step 302, metadata associated with the plurality of datasets is retrieved for generating the trained data minimization based ML and NLP model. Further, at step 304, the trained data minimization based ML and NLP model is generated. In generating the trained data minimization based ML and NLP model, data processing is performed on the retrieved metadata to handle missing data, noisy data or a combination thereof by performing the one or more operations on the retrieved metadata at step 306. Furthermore, at step 308, one or more features are extracted from the retrieved metadata based on the one or more data attributes by performing feature engineering on the retrieved metadata. At step 310, the extracted one or more features of the plurality of datasets are scaled by using the one or more scaling techniques. At 312, the trained data minimization based ML and NLP model is generated based on the retrieved metadata, the one or more data attributes and the scaled one or more features. In an embodiment of the present disclosure, the machine learning and natural language algorithms 314, such as decision tree, random forest and the like are used for generating the trained data minimization based ML and NLP model. At step 316, one or more inputs may be received from the user corresponding to the one or more features, such that the one or more inputs along with the one or more features are used as an input to generate the data minimization based ML and NLP model. At step 318, the trained data minimization based ML and NLP model is evaluated to determine accuracy of the trained data minimization based ML and NLP model. Further, based on resultant accuracy of the trained data minimization based ML and NLP model, hyperparameter tuning is performed for the trained data minimization based ML and NLP model. At step 320, it is determined if the trained data minimization based ML and NLP model meets a predetermined accuracy level. When the trained data minimization based ML and NLP model does not meet the predetermined accuracy level, the trained data minimization based ML and NLP model is trained at step 304. When the trained data minimization based ML and NLP model meets the predetermined accuracy level, the trained data minimization based ML and NLP model is considered as final trained data minimization based ML and NLP model 322. At step 324, the metadata associated with the plurality of datasets is retrieved from the storage unit 206 as test data. Furthermore, at step 326, one or more characteristics of the retrieved metadata is determined based on the one or more data parameters and the one or more derived data parameters corresponding to the plurality of datasets. At step 328, the trained data minimization based ML and NLP model 322 is used to generate the one or more minimization parameters and the one or more data sensitivity parameters for each of the plurality of datasets by applying the determined one or more characteristics onto the trained data minimization based ML and NLP model 322. At step 330, the portions of the plurality of datasets are determined based on the one or more minimization parameters, the one or more data sensitivity parameters, the privacy regulations and the business requirements by using the trained data minimization based ML and NLP model 322. Further, at step 332, the one or more minimizing operations are performed on the determined portions of the plurality of datasets based on the prestored rules to minimize the plurality of datasets. In an exemplary embodiment of the present disclosure, the one or more minimizing operations include securely deleting the portions of the plurality datasets remotely by using the agent 110, securely redacting the portions of the plurality datasets remotely by using the agent 110, outputting one or more recommendations on the one or more user devices 102 associated with the user to delete or redact the portions of the plurality datasets and the like.

Figure 4:
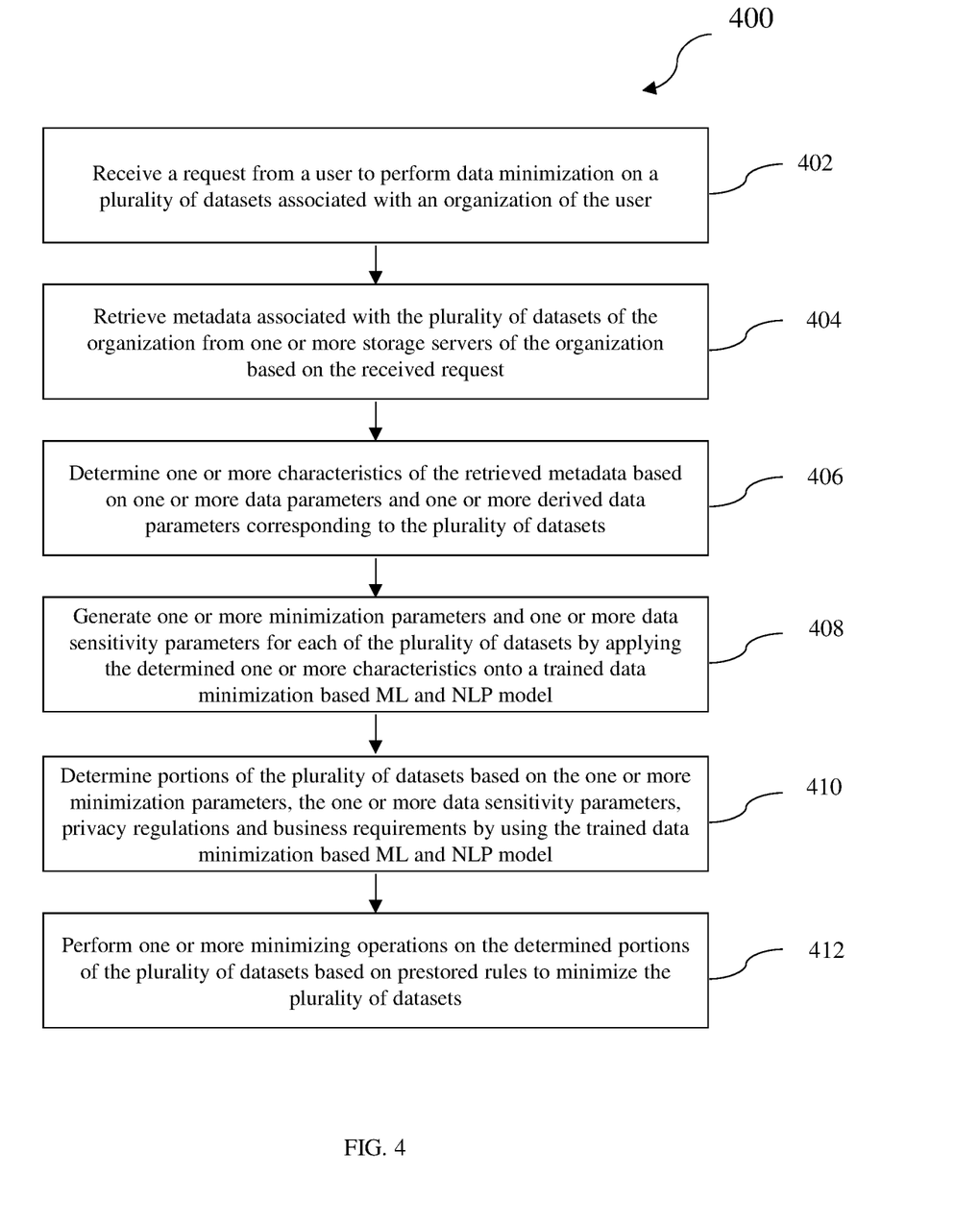
FIG. 4 is a process flow diagram illustrating an exemplary method for performing data minimization without reading the data content, in accordance with an embodiment of the present disclosure.

FIG. 4 is a process flow diagram illustrating an exemplary method for performing data minimization without reading data content, in accordance with an embodiment of the present disclosure. At step 402, a request is received from a user to perform data minimization on a plurality of datasets associated with an organization of the user. In an exemplary embodiment of the present disclosure, the plurality of datasets include business data, personal data, security data, consumer data and the like. In an embodiment of the present disclosure, the plurality of datasets are stored in one or more storage servers 108 of the organization. In an exemplary embodiment of the present disclosure, the one or more storage servers 108 is the local server or the cloud storage.

At step 404, metadata associated with the plurality of datasets of the organization is retrieved from the one or more storage servers 108 of the organization based on the received request. In an embodiment of the present disclosure, an agent 110 is deployed at the one or more storage servers 108 to collect the metadata associated with the plurality of datasets based on the received request and store the collected metadata in a storage unit 206. In collecting the metadata, the agent 110 discovers and scans the metadata associated with the plurality of data sets, such that the metadata may be collected. The agent 110 may be a script. In another embodiment of the present disclosure, the agent 110 may collect the metadata associated with the plurality of datasets after a predefined interval of time and store the collected metadata in the storage unit 206.

At step 406, one or more characteristics of the retrieved metadata is determined based on one or more data parameters and one or more derived data parameters corresponding to the plurality of datasets. In an embodiment of the present disclosure, the one or more characteristics are determined by performing data characterization on the retrieved metadata. In an exemplary embodiment of the present disclosure, the one or more data parameters and the one or more derived data parameters include data age, access recency, modified recency, depth, size, written, extension, date created, date modified, data accessed, path, auto tags, unwritten, un-accessed, extensions and owner. In an embodiment of the present disclosure, the one or more derived parameters are derived from the one or more data parameters.

At step 408, one or more minimization parameters and one or more data sensitivity parameters are generated for each of the plurality of datasets by applying the determined one or more characteristics onto a trained data minimization based ML and NLP model. In an exemplary embodiment of the present disclosure, the trained data minimization based ML and NLP model may be decision tree, random forest and the like. In an exemplary embodiment of the present disclosure, the one or more minimization parameters and the one or more data sensitivity parameters include Indicator of Minimization (IoM), Indicators of Privacy Use (IoPU), Indicators of Confidentiality (IoC), data stratification and risk score. The IoM is used to determine if the plurality of datasets are required to be minimized. The IoPU is used to determine if the plurality of datasets include private information. Furthermore, the IoC is used to determine if the plurality of datasets include confidential information. The data stratification is used to determine if the plurality of datasets are required to be stratified. The risk score is used to determine of the plurality of datasets required to be deleted or retained. For example, when the risk score associated with a dataset is above 90, the dataset should be deleted. Further, when the risk score associated with a dataset is below 60, the dataset should be retained. In an embodiment of the present disclosure, the user may provide a set of inputs to define data assets and accuracy of results. The user may provide an input corresponding to risk scores and tagging of assets based on specific requirements which may be further used to improve accuracy of large dataset.

In an embodiment of the present disclosure, before using the trained data minimization based ML and NLP model, the trained data minimization based ML and NLP model is required to be trained. The method 400 includes generating the trained data minimization based ML and NLP model. In generating the trained data minimization based ML and NLP model, the method 400 includes performing one or more operations on the retrieved metadata to handle missing data, noisy data or a combination thereof. In an embodiment of the present disclosure, the one or more operations are performed to avoid uncertainties while generating the trained data minimization based ML and NLP model. The one or more operations are performed on the retrieved metadata to transform the metadata into a usable form, such that the trained data minimization based ML and NLP model may be generated. In an exemplary embodiment of the present disclosure, the one or more operations include missing data imputation, typecasting, handling duplicates, outliers and the like. Further, the method 400 includes extracting one or more features from the retrieved metadata based on one or more data attributes upon performing the one or more operations. In an embodiment of the present disclosure, the one or more features are extracted by performing feature engineering on the retrieved metadata. In an exemplary embodiment of the present disclosure, the one or more data attributes include path, date of creation, date of modification, access date, extension of each of the plurality of datasets and the like. In an exemplary embodiment of the present disclosure, the one or more features include access recency, modification recency, data age, department and the like. Furthermore, the method 400 includes scaling the extracted one or more features of the plurality of datasets by using one or more scaling techniques. In an embodiment of the present disclosure, the extracted one or more features are scaled to prevent the trained data minimization based ML and NLP model from being biased towards the one or more features. In an exemplary embodiment of the present disclosure, the one or more scaling techniques include standardization technique and normalization technique. The method 400 includes generating the trained data minimization based ML and NLP model based on the retrieved metadata, the one or more data attributes and the scaled one or more features. In an embodiment of the present disclosure, one or more inputs may be received from the user corresponding to the one or more features, such that the one or more inputs along with the one or more features are used as an input to generate the trained data minimization based ML and NLP model. In an embodiment of the present disclosure, the trained data minimization based ML and NLP model converts one or more file paths into the one or more features, such that the one or more features associated with the one or more file paths may be converted into a machine-readable format.

In an embodiment of the present disclosure, after generating the data minimization based ML and NLP model, the trained data minimization based ML and NLP model is evaluated to determine if the trained data minimization based ML and NLP model meets a predetermined accuracy level. Further, based on resultant accuracy of the trained data minimization based ML and NLP model, hyperparameter tuning for the trained data minimization based ML and NLP model is performed for generating a generalized model to adapt to new information and provide accurate output to new data.

At step 410, portions of the plurality of datasets are determined based on the one or more minimization parameters, the one or more data sensitivity parameters, privacy regulations and business requirements by using the trained data minimization based ML and NLP model. For example, a company faces a legal action by regulators to search and delete data of citizens or data subjects has requested deletion of data associated with them by claiming their legal rights. In the current example, the legal action by the regulator and request of the data subjects to delete the data associated with them are business requirements. In an exemplary embodiment of the present disclosure, the privacy regulations may be The General Data Protection Regulation 2016/679, EU (GDPR), California Consumer Privacy Act (CCPA) and the like. In an embodiment of the present disclosure, geolocation of the plurality of datasets is recorded and tagged based on initial and repetitive scan of the plurality of datasets, user input or a combination thereof. In an embodiment of the present disclosure, the geolocation of the plurality of datasets is tracked throughout the lifecycle. Further, geolocation of data subject is recorded by one or more personal data fields, such as address, phone number and the like and maintained throughput lifecycle. In the current scenario, the data subject is the user. In an embodiment of the present disclosure, the privacy regulations used for determining the portions of the plurality of datasets is determined based on the geolocation of the plurality of datasets and the geolocation of the data subjects. In determining the portions of the plurality of datasets based on the one or more minimization parameters, the one or more data sensitivity parameters, the privacy regulations and the business requirements by using the trained data minimization based ML and NLP model to achieve the data minimization, the method 400 includes classifying one or more portions of the plurality of datasets into sensitive data, Personally Identifiable Information (PII), non-sensitive data, sensitive data, private data, confidential data or any combination thereof based on the one or more minimization parameters, the one or more data sensitivity parameters, the privacy regulations and the business requirements by using the trained data minimization based ML and NLP model. Further, the method 400 includes classifying one or more portions of the plurality of datasets into relevant data, irrelevant data or a combination thereof based on the one or more minimization parameters, the one or more data sensitivity parameters, the privacy regulations and the business requirements by using the trained data minimization based ML and NLP model. In an embodiment of the present disclosure, the relevant data is data associated with the plurality of datasets which is not redundant and required for long term storage. The method 400 includes determining the portions of the plurality of datasets based on the classified one or more portions by using the trained data minimization based ML and NLP model.

At step 412, one or more minimizing operations are performed on the determined portions of the plurality of datasets based onprestored rules to minimize the plurality of datasets. In an embodiment of the present disclosure, the prestored rules are used to determine which operation needs to be performed on portions of the plurality of datasets. In an exemplary embodiment of the present disclosure, the one or more minimizing operations include securely deleting the portions of the plurality datasets remotely by using the agent 110, securely redacting the portions of the plurality datasets remotely by using the agent 110, outputting one or more recommendations on one or more user devices 102 associated with the user to delete or redact the portions of the plurality datasets and the like. In an exemplary embodiment of the present disclosure, the one or more user devices 102 may include a laptop computer, desktop computer, tablet computer, smartphone, wearable device, smart watch and the like.

In an embodiment of the present disclosure, the method 400 includes prioritizing the one or more features based on one or more user recommendations. In an embodiment of the present disclosure, the one or more recommendations improve accuracy of the trained data minimization based ML and NLP model. For example, when the user recommends that a file or a folder is a data asset or not, the user recommendation is provided as an input to the trained data minimization based ML and NLP model for achieving better decision-making capabilities for analyzing the data.

Further, the method 400 includes generating a compliance certificate based on one or more deletion parameters upon deleting the portions of the plurality datasets. In an exemplary embodiment of the present disclosure, the one or more deletion parameters include size of datasets deleted, number of the datasets deleted, type of the datasets deleted and the like. In an embodiment of the present disclosure, lifecycle corresponding to deletion of the portions of the plurality of datasets is tracked to enforce and keep proof of Right To Be Forgotten (RTBF) for regulatory or recording purposes.

In an embodiment of the present disclosure, the trained data minimization based ML and NLP model performs reinforcement learning based on the extracted one or more features, the one or more characteristics, the generated one or more minimization parameters, the generated one or more data sensitivity parameters and the one or more minimizing operations. In an embodiment of the present disclosure, the reinforcement learning improves accuracy of the trained data minimization based ML and NLP model.

The method 400 may be implemented in any suitable hardware, software, firmware, or combination thereof.

Thus, various embodiments of the present computing system 104 provide for performing data minimization without reading data content. Since, the computing system 104 minimizes the plurality of datasets associated with the organization without reading content of the plurality of datasets, the computing system 104 is efficient and saves lot of time of the user. Further, the computing system 104 also consider the business requirements and privacy regulations while determining portions of the plurality of datasets. The computing system 104 may perform the one or more minimizing operations, such as securely deleting the portions of the plurality datasets remotely by using the agent 110, securely redacting the portions of the plurality datasets remotely by using the agent 110, outputting one or more recommendations on the one or more user devices 102 associated with the user to delete or redact the portions of the plurality datasets and the like to minimize the plurality of datasets.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random-access memory (RAM), a read-only memory (ROM), a rigid magnetic disk and an optical disk. Current examples of optical disks include compact disk-read only memory (CD-ROM), compact disk-read/write (CD-R/W) and DVD.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments may include a hardware configuration of an information handling/computer system in accordance with the embodiments herein. The system herein comprises at least one processor or central processing unit (CPU). The CPUs are interconnected via system bus 208 to various devices such as a random-access memory (RAM), read-only memory (ROM), and an input/output (I/O) adapter. The I/O adapter can connect to peripheral devices, such as disk units and tape drives, or other program storage devices that are readable by the system. The system can read the inventive instructions on the program storage devices and follow these instructions to execute the methodology of the embodiments herein.

The system further includes a user interface adapter that connects a keyboard, mouse, speaker, microphone, and/or other user interface devices such as a touch screen device (not shown) to the bus to gather user input. Additionally, a communication adapter connects the bus to a data processing network, and a display adapter connects the bus to a display device which may be embodied as an output device such as a monitor, printer, or transmitter, for example.

A description of an embodiment with several components in communication with each other does not imply that all such components are required. On the contrary, a variety of optional components are described to illustrate the wide variety of possible embodiments of the invention. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments of the invention need not include the device itself.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the embodiments of the present invention are intended to be illustrative, but not limiting, of the scope of the invention, which is set forth in the following claims.

The invention claimed is:

1. A computing system for performing data minimization without reading data content, the computing system comprising:
   one or more hardware processors; and
   a memory coupled to the one or more hardware processors, wherein the memory comprises a plurality of modules in the form of programmable instructions executable by the one or more hardware processors, wherein the plurality of modules comprises:
   a data receiver module configured to:

receive a request from a user to perform data minimization on a plurality of datasets associated with an organization of the user;

retrieve metadata associated with the plurality of datasets of the organization from one or more storage servers of the organization based on the received request;

a characteristics determination module configured to determine one or more characteristics of the retrieved metadata based on one or more data parameters and one or more derived data parameters corresponding to the plurality of datasets;

a model generation module configured to generate a trained data minimization based ML and NLP model, wherein the model generation module is configured to:

perform one or more operations on the retrieved metadata to handle at least one of: missing data and noisy data, wherein the one or more operations comprise: missing data imputation, typecasting, handling duplicates and outliers;

extract one or more features from the retrieved metadata based on one or more data attributes upon performing the one or more operations, wherein the one or more data attributes comprise: path, date of creation, date of modification, access date and extension of each of the plurality of datasets and wherein the one or more features comprise: access recency, modification recency, data age and department;

scale the extracted one or more features of the plurality of datasets; and generate the trained data minimization based ML and NLP model based on the retrieved metadata, the one or more data attributes and the scaled one or more features;

a data generation module configured to generate one or more minimization parameters and one or more data sensitivity parameters for each of the plurality of datasets by applying the determined one or more characteristics onto the trained data minimization based Machine Learning (ML) and Natural Language Processing (NLP) model;

a data determination module configured to determine portions of the plurality of datasets based on the one or more minimization parameters, the one or more data sensitivity parameters, privacy regulations and business requirements by using the trained data minimization based ML and NLP model; and an operation performance module configured to perform one or more minimizing operations on the determined portions of the plurality of datasets based on prestored rules to minimize the plurality of datasets.

2. The computing system of claim 1, wherein the one or more data parameters and the one or more derived data parameters comprise: data age, access recency, modified recency, depth, size, written, extension, date created, date modified, data accessed, path, auto tags, unwritten, unaccessed, extensions and owner.

3. The computing system of claim 1, further comprises a prioritizing module configured to prioritize the one or more features based on one or more user recommendations.

4. The computing system of claim 1, wherein the one or more minimization parameters and the one or more data sensitivity parameters comprise: Indicator of Minimization (IoM), Indicators of Privacy Use (IoPU), Indicators of Confidentiality (IoC), data stratification and risk score.

5. The computing system of claim 1, wherein in determining the portions of the plurality of datasets based on the one or more minimization parameters, the one or more data sensitivity parameters, the privacy regulations and the business requirements by using the trained data minimization based ML and NLP model, the data determination module is configured to:

classify one or more portions of the plurality of datasets into at least one or a combination of: sensitive data, Personally Identifiable Information (PII), non-sensitive data, sensitive data, private data and confidential data based on the one or more minimization parameters, the one or more data sensitivity parameters, the privacy regulations and the business requirements by using the trained data minimization based ML and NLP model;

classifying one or more portions of the plurality of datasets into at least one or combination of: relevant data and irrelevant data based on the one or more minimization parameters, the one or more data sensitivity parameters, the privacy regulations and the business requirements by using the trained data minimization based ML and NLP model; and determine the portions of the plurality of datasets based on the classified one or more portions by using the trained data minimization based ML and NLP model.

6. The computing system of claim 1, wherein the one or more minimizing operations comprise at least one of: securely deleting the portions of the plurality datasets remotely by using an agent, securely redacting the portions of the plurality datasets remotely by using the agent and outputting one or more recommendations on one or more user devices associated with the user to one of: delete and redact the portions of the plurality datasets.

7. The computing system of claim 1, wherein the data generation module is further configured to generate a compliance certificate based on one or more deletion parameters upon deleting the portions of the plurality datasets, wherein the one or more deletion parameters comprise: size of datasets deleted, number of the datasets deleted and type of the datasets deleted.

8. A method for performing data minimization without reading data content, the method comprising:

receiving, by one or more hardware processors, a request from a user to perform data minimization on a plurality of datasets associated with an organization of the user;

retrieving, by the one or more hardware processors, metadata associated with the plurality of datasets of the organization from one or more storage servers of the organization based on the received request;

determining, by the one or more hardware processors, one or more characteristics of the retrieved metadata based on one or more data parameters and one or more derived data parameters corresponding to the plurality of datasets;

generating, by the one or more hardware processors, a trained data minimization based ML and NLP model by:

performing, by the one or more hardware processors, one or more operations on the retrieved metadata to handle at least one of: missing data and noisy data, wherein the one or more operations comprise: missing data imputation, typecasting, handling duplicates and outliers;

extracting, by the one or more hardware processors, one or more features from the retrieved metadata based on one or more data attributes upon performing the one or more operations, wherein the one or more data attributes comprise: path, date of creation, date of modification, access date and extension of each of the plurality of datasets and wherein the one or more features comprise: access recency, modification recency, data age and department;

scaling, by the one or more hardware processors, extracted one or more features of the plurality of datasets; and generating, by the one or more hardware processors, trained data minimization based ML and NLP model based on the retrieved metadata, the one or more data attributes and the scaled one or more features;

generating, by the one or more hardware processors, one or more minimization parameters and one or more data sensitivity parameters for each of the plurality of datasets by applying the determined one or more characteristics onto the trained data minimization based Machine Learning (ML) and Natural Language Processing (NLP) model;

determining, by the one or more hardware processors, portions of the plurality of datasets based on the one or more minimization parameters, the one or more data sensitivity parameters, privacy regulations and business requirements by using the trained data minimization based ML and NLP model; and performing, by the one or more hardware processors, one or more minimizing operations on the determined portions of the plurality of datasets based on prestored rules to minimize the plurality of datasets.

9. The method of claim 8, wherein the one or more data parameters and the one or more derived data parameters comprise: data age, access recency, modified recency, depth, size, written, extension, date created, date modified, data accessed, path, auto tags, unwritten, un-accessed, extensions and owner.

10. The method of claim 8, further comprises prioritizing the one or more features based on one or more user recommendations.

11. The method of claim 8, wherein the one or more minimization parameters and the one or more data sensitivity parameters comprise: Indicator of Minimization (IoM), Indicators of Privacy Use (IoPU), Indicators of Confidentiality (IoC), data stratification and risk score.

12. The method of claim 8, wherein determining the portions of the plurality of datasets based on the one or more minimization parameters, the one or more data sensitivity parameters, the privacy regulations and the business requirements by using the trained data minimization based ML and NLP model comprises:

classifying one or more portions of the plurality of datasets into at least one or a combination of: sensitive data, Personally Identifiable Information (PII), non-sensitive data, sensitive data, private data and confidential data based on the one or more minimization parameters, the one or more data sensitivity parameters, the privacy regulations and the business requirements by using the trained data minimization based ML and NLP model;

classifying one or more portions of the plurality of datasets into at least one or a combination of: relevant data and irrelevant data based on the one or more minimization parameters, the one or more data sensitivity parameters, the privacy regulations and the business requirements by using the trained data minimization based ML and NLP model; and determining the portions of the plurality of datasets based on the classified one or more portions by using the trained data minimization based ML and NLP model.

13. The method of claim 8, wherein the one or more minimizing operations comprise at least one of: securely deleting the portions of the plurality datasets remotely by using an agent, securely redacting the portions of the plurality datasets remotely by using the agent and outputting one or more recommendations on one or more user devices associated with the user to one of: delete and redact the portions of the plurality datasets.

14. The method of claim 8, further comprises generating a compliance certificate based on one or more deletion parameters upon deleting the portions of the plurality datasets, wherein the one or more deletion parameters comprise: size of datasets deleted, number of the datasets deleted and type of the datasets deleted.

\* \* \* \* \*